United States Patent
Ning et al.

(10) Patent No.: US 8,853,688 B2
(45) Date of Patent: Oct. 7, 2014

(54) DISPLAY APPARATUS AND METHOD OF MANUFACTURING THE DISPLAY APPARATUS

(71) Applicant: Samsung Display Co., Ltd., Yongin (KR)

(72) Inventors: Honglong Ning, Suwon-si (KR); Byeong-Beom Kim, Asan-si (KR); Kyungseop Kim, Hwaseong-si (KR); Joonyong Park, Gunpo-si (KR); Changoh Jeong, Suwon-si (KR); Sangwon Shin, Yongin-si (KR); Dongmin Lee, Anyang-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/693,830

(22) Filed: Dec. 4, 2012

(65) Prior Publication Data

US 2014/0042428 A1     Feb. 13, 2014

(30) Foreign Application Priority Data

Aug. 7, 2012   (KR) .......................... 10-2012-0086445

(51) Int. Cl.
*H01L 29/10*   (2006.01)
*H01L 33/42*   (2010.01)
*H01L 33/00*   (2010.01)
*H01L 21/77*   (2006.01)

(52) U.S. Cl.
CPC ............ *H01L 33/42* (2013.01); *H01L 33/0041* (2013.01); *H01L 21/77* (2013.01)
USPC ......................................................... 257/43

(58) Field of Classification Search
CPC ............ H01L 29/7869; H01L 27/1225; H01L 21/02554; H01L 21/02565; H01L 27/12; H01L 29/4908; H01L 29/78
USPC .......................................................... 257/43
See application file for complete search history.

(56) References Cited

U.S. PATENT DOCUMENTS

| 6,335,232 | B1  | 1/2002 | Ohori et al. |
| 7,566,667 | B2  | 7/2009 | Lee et al. |
| 8,101,949 | B2  | 1/2012 | Ye |
| 2003/0180990 | A1 * | 9/2003 | Seo et al. ...................... 438/151 |

(Continued)

FOREIGN PATENT DOCUMENTS

| JP | 2001-183639 | 7/2001 |
| KR | 10-2001-0004359 | 1/2001 |

(Continued)

*Primary Examiner* — Zandra Smith
*Assistant Examiner* — Paul Patton
(74) *Attorney, Agent, or Firm* — Innovation Counsel LLP

(57) ABSTRACT

A display apparatus includes a base substrate and a buffer layer disposed on the base substrate. The display apparatus further includes an oxide semiconductor layer disposed on the buffer layer and including a source electrode, a drain electrode, and a channel portion. The display apparatus further includes a gate insulating layer disposed on the channel portion, a gate electrode disposed on the gate insulating layer, and a protective layer disposed on the gate electrode and the buffer layer and having a contact hole. The display apparatus further includes a transparent electrode overlapping a portion of the protective layer and electrically connected to one of the source electrode and the drain electrode through the contact hole. The transparent electrode includes a transparent metal layer and a transparent conductive oxide layer overlapping the transparent metal layer.

8 Claims, 13 Drawing Sheets

(56) References Cited

U.S. PATENT DOCUMENTS

2005/0127443 A1* 6/2005 Ishikawa .................. 257/347
2010/0065842 A1 3/2010 Yamazaki et al.
2010/0308325 A1* 12/2010 Imai .............................. 257/43
2012/0001168 A1 1/2012 Ichijo et al.

FOREIGN PATENT DOCUMENTS

| KR | 10-2001-0094840 | 11/2001 |
| KR | 10-2006-0004466 | 1/2006 |
| KR | 10-2010-0098304 | 9/2010 |
| KR | 10-2011-0076372 | 7/2011 |

* cited by examiner

US 8,853,688 B2

DISPLAY APPARATUS AND METHOD OF MANUFACTURING THE DISPLAY APPARATUS

CROSS-REFERENCE TO RELATED APPLICATION

This U.S. non-provisional patent application claims priority and benefit under 35 U.S.C. §119 of Korean Patent Application No. 10-2012-0086445, filed on Aug. 7, 2012 in the Korean Intellectual Property Office, the contents of which are herein incorporated by reference in their entirety.

BACKGROUND

1. Field of the Invention

The present invention relates to a display apparatus and a method of manufacturing the display device. More particularly, the present invention relates to a display apparatus having an oxide semiconductor transistor and relates to a method of manufacturing the display apparatus.

2. Description of the Related Art

A liquid crystal display may include a color filter substrate, an array substrate, and a liquid crystal layer disposed between the color filter substrate and the array substrate.

An active matrix method used for the liquid crystal display may involve driving liquid crystal molecules in a pixel part using an amorphous silicon thin film transistor (a-Si TFT) as a switching device.

The a-Si TFT of the liquid crystal display may be manufactured in a low-temperature process. Nevertheless, but the a-Si TFT may have undesirably low mobility and may not satisfy a constant current bias condition. On the other hand, a polycrystalline silicon thin film transistor may have sufficiently high mobility and may satisfy the constant current bias condition. Nevertheless, but the polycrystalline silicon thin film transistor may not be suitable for a large-scale display device, and may need to be manufactured in a high temperature process.

SUMMARY

One or more embodiments of the invention may be related to a display apparatus with satisfactory channel stability in an oxide semiconductor transistor and with satisfactorily low contact resistance between a pixel electrode and an electrode of the oxide semiconductor transistor.

One or more embodiments of the invention may be related to a display apparatus that may include a base substrate and a buffer layer disposed on the base substrate. The display device may further include an oxide semiconductor layer disposed on the buffer layer and including a source electrode, a drain electrode, and a channel portion. The display device may further include a gate insulating layer disposed on the channel portion, a gate electrode disposed on the gate insulating layer, and a protective layer disposed on the gate electrode and the buffer layer and having a first contact hole. The display device may further include a first transparent electrode overlapping a first portion of the protective layer and electrically connected to one of the source electrode and the drain electrode through the first contact hole. The first transparent electrode may include a first transparent metal layer and a first transparent conductive oxide layer overlapping the first transparent metal layer.

In one or more embodiments, the display device may further include an oxide insulating layer overlapping a second portion of the protective layer and abutting the first transparent metal layer.

In one or more embodiments, the first transparent metal layer may include titanium and may have a thickness in a range of about 20 angstroms to about 300 angstroms.

In one or more embodiments, the display apparatus may further include a second transparent electrode. The protective layer further may have a second contact hole. The second transparent electrode may be electrically connected to another one of the source electrode and the drain electrode through the second contact hole. The second transparent electrode may include a second transparent metal layer and a second transparent conductive oxide layer. The second transparent metal layer may abut the oxide insulating layer and may be connected through the oxide insulating layer to the first transparent metal layer.

In one or more embodiments, the protective layer may further have a third contact hole. The second transparent electrode may be electrically connected to a data line through the third contact hole. The second transparent metal layer may be disposed between the second transparent conductive oxide layer and the data line.

In one or more embodiments, the oxide insulating layer may include titanium dioxide (TiOx).

In one or more embodiments, the oxide semiconductor layer may include an amorphous zinc oxide semiconductor material.

In one or more embodiments, the oxide semiconductor layer may include an amorphous indium gallium zinc oxide (a-IGZO) semiconductor material.

One or more embodiments of the invention may be related to a method of manufacturing a display apparatus, such as the aforementioned display apparatus. The method may include forming a buffer layer on a base substrate. The method may further include forming an oxide semiconductor layer on the buffer layer. The method may further include forming a gate insulating layer on a first portion of the oxide semiconductor layer. The method may further include forming a gate electrode on the gate insulating layer. The method may further include forming a protective layer on the gate electrode and the buffer layer. The protective layer may have a first contact hole. The method may further include processing a second portion of the oxide semiconductor layer such that an electrical resistance of the second portion of the oxide semiconductor layer may be different from (e.g., lower than) an electrical resistance of the first portion of the oxide semiconductor layer. The method may further include forming a transparent metal layer that is electrically connected to the second portion of the oxide semiconductor layer through the first contact hole. The method may further include oxidizing a first portion of the transparent metal layer to form an oxide insulating layer.

In one or more embodiments, the first portion of the transparent metal layer may overlap the gate electrode.

In one or more embodiments, the method may include forming a transparent conductive oxide layer on the transparent metal layer. The method may further include patterning the transparent conductive oxide layer to form a transparent conductive oxide electrode layer.

In one or more embodiments, the transparent metal layer may include titanium and may have a thickness in a range of about 20 angstroms to about 300 angstroms.

In one or more embodiments, a second portion of the transparent metal layer may abut the oxide insulating layer and may be electrically connected to the second portion of the oxide semiconductor layer through the first contact hole. The protective layer may further have a second contact hole. A third portion of the transparent metal layer may abut the oxide insulating layer, may be electrically connected to a third portion of the oxide semiconductor layer through the second contact hole, and may be connected through the oxide insulating layer to the second portion of the transparent metal layer.

In one or more embodiments, the method may include using the transparent conductive oxide electrode layer as a mask to cover a second portion of the transparent metal layer when oxidizing the first portion of the transparent metal layer. The second portion of the transparent metal layer may be electrically connected to the second portion of the oxide semiconductor layer through the first contact hole.

In one or more embodiments, the oxide insulating layer may include titanium dioxide (TiOx).

In one or more embodiments, method may include the following steps: before the step of oxidizing the first portion of the transparent metal layer, disposing a mask to cover a second portion of the transparent metal layer, wherein the second portion of the transparent metal layer may be electrically connected to the second portion of the oxide semiconductor layer through the first contact hole; after the step of oxidizing the first portion of the transparent metal layer, removing the mask; and after the step of removing the mask, forming a transparent conductive oxide electrode layer on the second portion of the transparent metal layer.

In one or more embodiments, the method may include the following steps: before the step of oxidizing the first portion of the transparent metal layer, disposing a transparent conductive oxide layer on the second portion of the transparent metal layer, wherein a first portion of the transparent conductive oxide layer may cover the first portion of the transparent metal layer, wherein a second portion of the transparent conductive oxide layer may cover a second portion of the transparent metal layer, and wherein the second portion of the transparent metal layer may be electrically connected to the second portion of the oxide semiconductor layer through the first contact hole; disposing a mask to cover the second portion of the transparent conductive oxide layer; before the step of oxidizing the first portion of the transparent metal layer, removing the first portion of the transparent conductive oxide layer; and after the step of oxidizing the first portion of the transparent metal layer, removing the mask.

In one or more embodiments, the oxide semiconductor layer may include an amorphous zinc oxide semiconductor material.

In one or more embodiments, the oxide semiconductor layer may include an amorphous indium gallium zinc oxide (a-IGZO) semiconductor material.

In one or more embodiments, the step of oxidizing the first portion of the transparent metal layer may include exposing the first portion of the transparent metal layer to oxygen-containing plasma for at least 300 seconds.

One or more embodiments of the invention may be related to a display apparatus that may include the following elements: a base substrate, a buffer layer that covers the base substrate, an oxide semiconductor layer disposed on the buffer layer and including a source electrode, a drain electrode, and a channel portion, a gate insulating layer that covers the channel portion of the oxide semiconductor layer, a gate electrode disposed on the gate insulating layer, a protective layer disposed on the gate electrode and the buffer layer and provided with first and second contact holes formed therethrough to respectively expose the source electrode and the drain electrode of the oxide semiconductor layer, and transparent electrodes disposed on a portion of the protective layer and electrically connected to the source electrode and the drain electrode respectively through the first and second contact holes.

The transparent electrodes may have a double-layer structure that includes a first electrode layer including a transparent metal material and a second electrode layer disposed on the first electrode layer and including a transparent conductive oxide.

One or more embodiments of the invention may be related to a method of manufacturing a display apparatus. The method may include the following steps: forming a buffer layer on a base substrate, forming an oxide semiconductor layer, which includes three portions for forming a source electrode, a drain electrode, and a channel portion, on the buffer layer, forming a gate insulating layer on the channel portion of the oxide semiconductor layer, forming a protective layer on the gate electrode and the buffer layer, the protective layer being provided with a first contact hole and a second contact hole through which the source electrode and the drain electrode are respectively exposed, and forming transparent electrodes on a portion of the protective layer, the transparent electrodes being electrically connected to the source electrode and the drain electrode through the first contact hole and the second contact hole.

The transparent electrodes have a double-layer structure that includes a first electrode layer including a transparent metal material and a second electrode layer disposed on the first electrode layer and including a transparent conductive oxide.

According to one or more embodiments of the invention, the transparent electrodes include the first electrode layer formed of the transparent metal material, and thus a contact resistance between the transparent electrodes and the source/drain electrode may be satisfactorily low. Thus, the driving voltage required to drive the pixel may be satisfactorily low.

In one or more embodiments, since the transparent electrodes have a double-layer structure that includes a metal layer, hydrogen atoms may be prevented from substantially diffusing to the channel portion. Accordingly, satisfactory channel stability of the thin film transistor associated with the channel portion may be substantially maintained.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION

Figure 1:
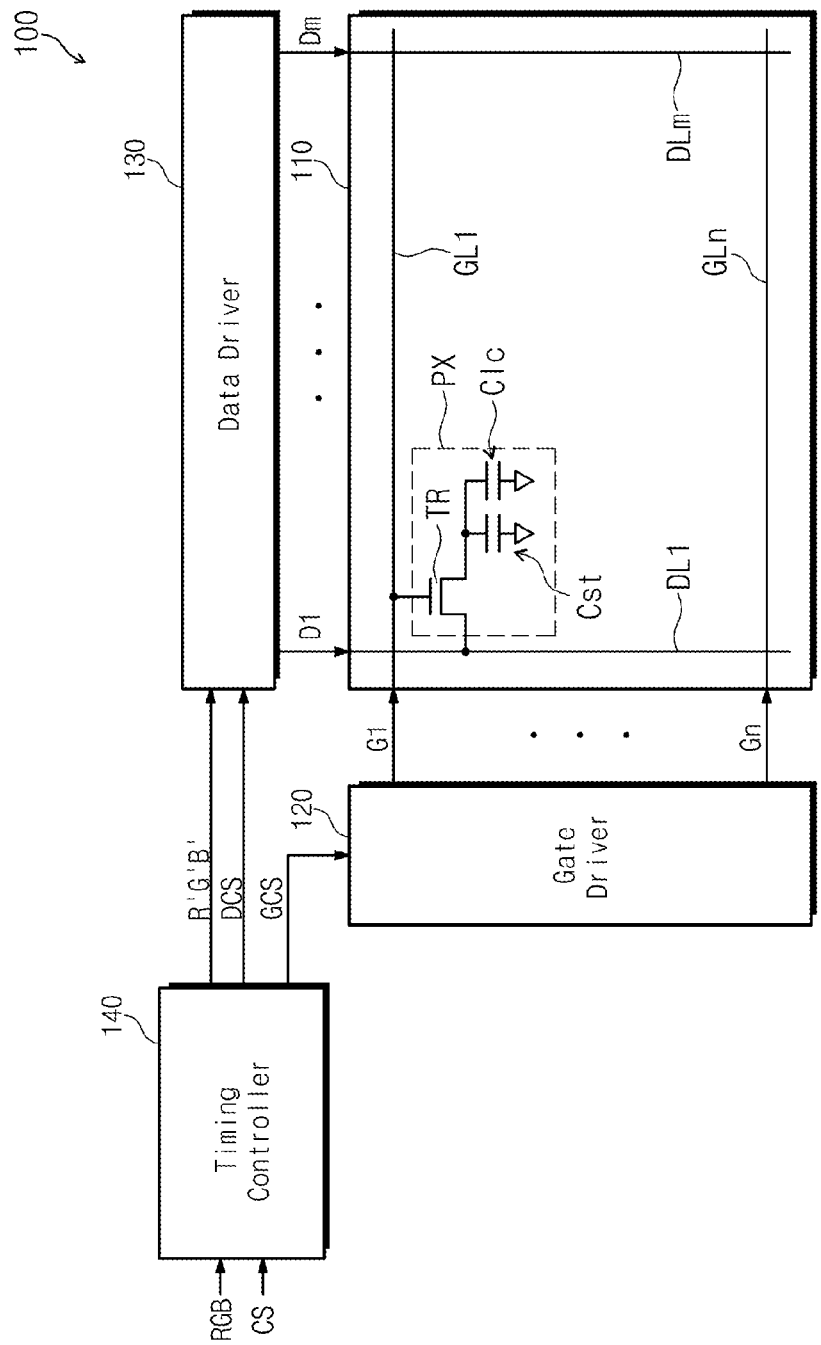
FIG. 1 is a block diagram illustrating a display apparatus according to one or more embodiments of the present invention.

It will be understood that when an element or layer is referred to as being "on", "connected to", or "coupled to" another element or layer, it can be directly on, connected to, or coupled to the other element or layer; additionally or alternatively, intervening elements or layers may be present between the two aforementioned elements or layers. In contrast, when an element is referred to as being "directly on," "directly connected to", or "directly coupled to" another element or layer, there are no intervening elements or layers present between the two aforementioned elements or layers. Like numbers may refer to like elements throughout the specification. As used herein, the term "and/or" may include any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention. The description of an element as a "first" element may not require or imply the presence of a second element or other elements. The terms first, second, third etc. may also be used herein to differentiate different categories of elements. For conciseness, the terms first, second, third, etc. may represent first-category, second-category, third-category, etc., respectively.

Spatially relative terms, such as "beneath", "below", "lower", "above", "upper", etc. may be used herein for ease of description to describe one element or feature's structural relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an", and "the" may be intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, the present invention will be explained in detail with reference to the accompanying drawings.

FIG. 1 is a block diagram illustrating a display apparatus according to one or more embodiments of the present invention.

Referring to FIG. 1, a display apparatus 100 includes a display panel 110, a gate driver 120, a data driver 130, and a timing controller 140.

The timing controller 140 may receive image signals RGB and control signals CS from an external source (not shown). The timing controller 140 converts a data format of the image signals RGB into a data format appropriate to an interface between the data driver 130 and the timing controller 140 and provides the converted image signals R'G'B' to the data driver 130. In addition, timing controller 140 applies a data control signal DCS, including one or more of an output start signal, a horizontal start signal, a polarity inversion signal, etc., to the data driver 130.

The timing controller 140 applies a gate control signal GCS, including one or more of a vertical start signal, a vertical clock signal, a vertical clock bar signal, etc., to the gate driver 120.

The gate driver 120 sequentially outputs gate signals G1 to Gn in response to the gate control signal GCS received from the timing controller 140.

The data driver 130 converts the image signals R'G'B' to data voltages D1 to Dm in response to the data control signal DCS received from the timing controller 140. The data voltages D1 to Dm are applied to the display panel 110.

The display panel 110 includes a plurality of gate lines GL1 to GLn, a plurality of data lines DL1 to DLm crossing the gate lines GL1 to GLn, and pixels PX.

In one or more embodiments, the pixels PX have analogous structures and functions, and thus for convenience of explanation, only one pixel has been illustrated in FIG. 1 as an example.

Each pixel PX includes a thin film transistor TR, a liquid crystal capacitor Clc, and a storage capacitor Cst. As an example, the liquid crystal capacitor Clc is formed by a pixel electrode and a common electrode overlapping the pixel electrode with a liquid crystal layer being disposed between the pixel electrode and the common electrode, and the storage capacitor Cst is formed by the pixel electrode and a storage electrode overlapping the pixel electrode with an insulating layer being disposed between the pixel electrode and the storage electrode.

The thin film transistor TR includes a gate electrode connected to a corresponding gate line of the gate lines GL1 to GLn, a source electrode connected to a corresponding data line of the data lines DL1 to DLm, and a drain electrode connected to the pixel electrode.

The gate lines GL1 to GLn are connected to the gate driver 120 to receive the gate signals G1 to Gn. The data lines DL1 to DLm are connected to the data driver 130 to receive the data voltages D1 to Dm from the data driver 130.

The thin film transistor TR in each pixel PX is turned on in response to the gate signal provided through the corresponding gate line, and the data voltage provided through the corresponding data line is applied to the pixel electrode through the turned-on thin film transistor TR. The common electrode is applied with a common voltage.

In one or more embodiments, as illustrated in FIG. 1, the display panel 110 may be a liquid crystal display panel, in which each pixel PX includes the liquid crystal capacitor Clc. In one or more embodiment, the display panel 110 may include one or more of an organic light emitting device, an electrowetting device, and an electrophoretic device.

Although not illustrated in FIG. 1, in one or more embodiments, the display apparatus 100 may further include a backlight unit disposed adjacent to the display panel 110 to provide light to the display panel 110. The backlight unit includes a plurality of light sources, e.g., one or more of a plurality of light-emitting diodes, a plurality of cold cathode fluorescent lamps, etc.

Figure 2:
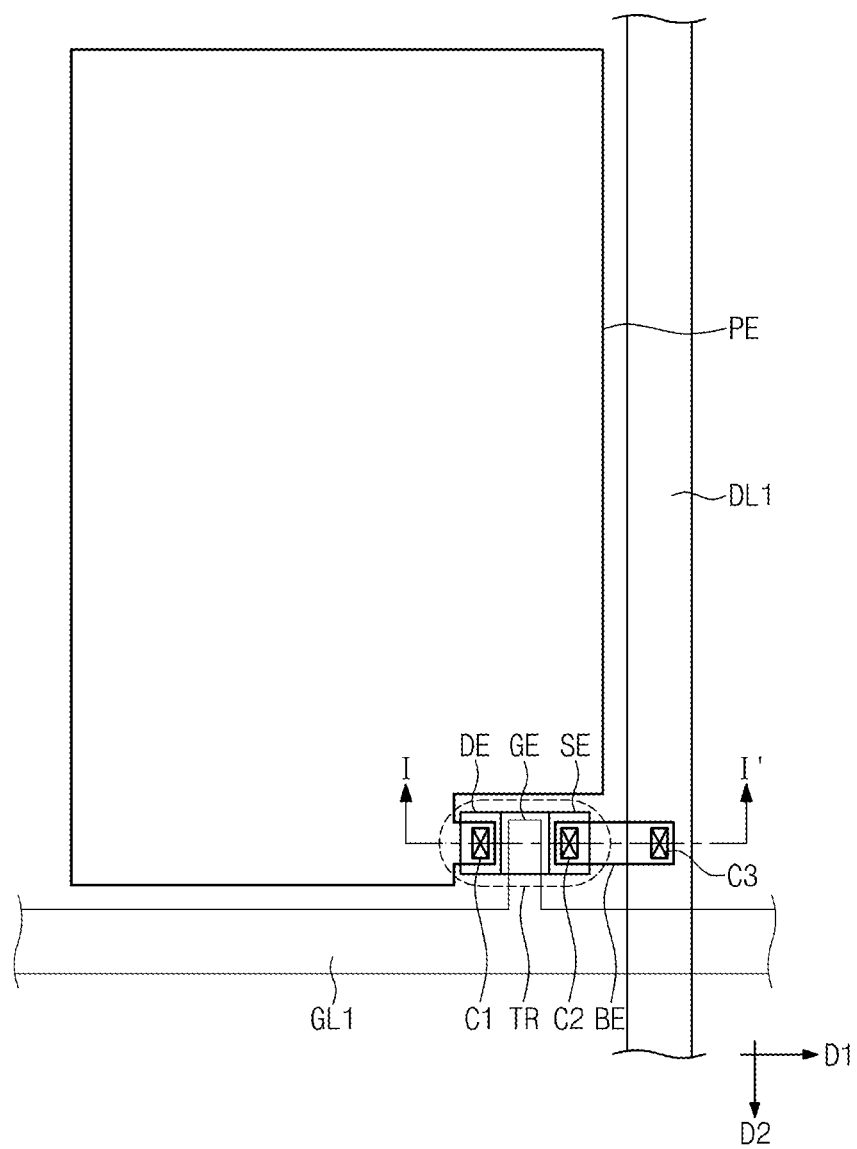
FIG. 2 is a plan view illustrating a pixel illustrated in FIG. 1.
Figure 3:
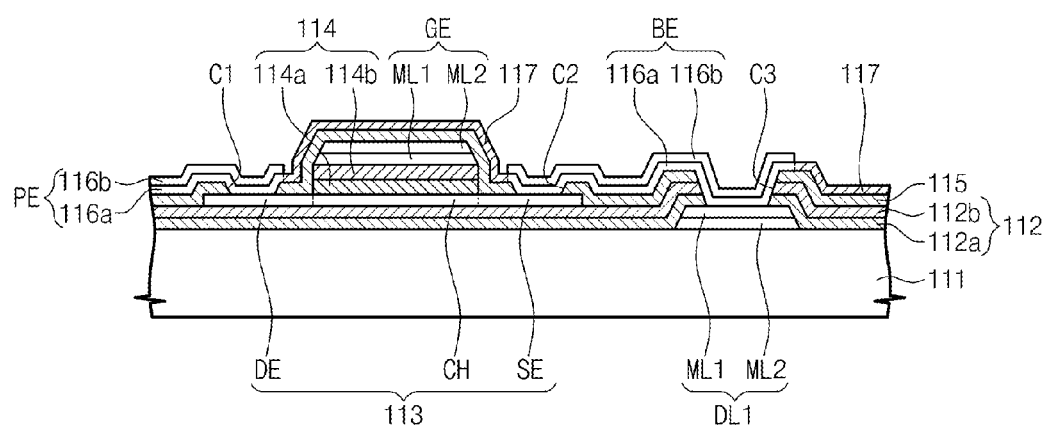
FIG. 3 is a cross-sectional view taken along a line I-I' of FIG. 2.

FIG. 2 is a plan view illustrating a pixel illustrated in FIG. 1, and FIG. 3 is a cross-sectional view taken along a line I-I' of FIG. 2. For convenience of explanation, FIGS. 2 and 3 illustrate one pixel as an example since the pixels have analogous structures and functions.

Although not both illustrated in figures, the display panel 110 may include two base substrates overlapping each other, wherein at least one of the two base substrates may have thin film transistors disposed thereon. In FIG. 3, a base substrate on which a thin film transistor is formed has been illustrated.

Referring to FIG. 2 and FIG. 3, a first gate line GL1 extending in a first direction D1 and a first data line DL1 extending in a second direction D2 are disposed on the base substrate 111 illustrated in FIG. 3. The second direction D2 may be substantially perpendicular to the first direction D1. The first data line DL1 crosses the first gate line GL1 and is electrically insulated from the first gate line GL1.

The thin film transistor TR connected to the first gate line GL1 and the first data line DL1, the pixel electrode PE electrically connected to the thin film transistor TR, and a bridge electrode BE electrically connecting the thin film transistor TR and the first data line DL1 are disposed on the base substrate 111.

The thin film transistor TR includes a gate electrode GE, a source electrode SE, and a drain electrode DE. The gate electrode GE is electrically connected to the first gate line GL1, the source electrode SE is electrically connected to the first data line DL1 through the bridge electrode BE, and the drain electrode DE is electrically connected to the pixel electrode PE. The thin film transistor TR may be turned on, in response to a gate signal, to apply the data voltage to the pixel electrode PE. In one or more embodiments, the thin film transistor TR may be, but not limited to, an oxide semiconductor transistor.

The base substrate 111 (illustrated in FIG. 3) includes a transparent insulating material, e.g., one or more of a transparent glass, a transparent plastic, etc. The first data line DL1 is formed on the base substrate 111 and may directly contact the base substrate 111. The first data line DL1 has a double-layer structure that includes titanium (Ti) and copper (Cu) in one or more embodiments. In one or embodiments, the first data line DL1 includes a first metal layer ML1, e.g., a titanium (Ti) layer, and a second metal layer ML2, e.g., a copper (Cu) layer, that is disposed on the first metal layer ML1. In one or more embodiments, the first data line DL1 may have a single-layer structure.

A buffer layer 112 is formed on the base substrate 111 to cover the first data line DL1. The buffer layer 112 prevents impurities, e.g., one or more of sodium, hydrogen, etc., existing in the base substrate 111 from infiltrating into an upper layer disposed on the buffer layer 112 during manufacturing processes.

In one or more embodiments, the buffer layer 112 may have a double-layer structure that includes silicon nitride (SiNx) and silicon oxide (SiOx). In one or more embodiments, a first layer 112a of the buffer layer 112 includes silicon nitride (SiNx), and a second layer 112b disposed on the first layer 112a of the buffer layer 112 includes silicon oxide (SiOx). The first layer 112a of the buffer layer 112 may prevent a potential hole defect from being formed in the second metal layer ML2 of the first data line DL1, wherein the potential hole defect may be caused by a reaction between copper of the first data line DL1 and oxygen of silicon oxide (SiOx) of the layer 112b. The second layer 112b of the buffer layer 112 may prevent hydrogen from infiltrating into an upper layer, e.g., an oxide semiconductor layer 113, disposed above the base substrate 111.

The oxide semiconductor layer 113 is disposed on the buffer layer 112 and includes a source electrode SE, a drain electrode DE, and a channel portion CH. The buffer layer 112 may be disposed between the oxide semiconductor layer 113 and the base substrate 111. The buffer layer 112 may directly contact one or more of the source electrode SE, the drain electrode DE, and the channel portion CH The source electrode SE and the drain electrode DE are respectively located at two different sides of the channel portion CH such that the channel portion CH is disposed between the source electrode SE and the drain electrode DE. The channel portion CH includes oxide semiconductor. The term "oxide semiconductor" used herein may mean a compound including oxygen and one or more of indium (In), gallium (Ga), zinc (Zn), and tin (Sn). The oxide semiconductor may be an amorphous oxide semiconductor or a crystalline oxide semiconductor. The amorphous oxide semiconductor may include indium gallium zinc oxide (IGZO). The crystalline oxide semiconductor may include one of zinc oxide (ZnO), indium zinc oxide (IZO), indium gallium oxide (IGO), indium zinc oxide (ITO), and indium oxide (InO).

Each of the source electrode SE and the drain electrode DE includes a low-resistance region. In one or more embodiment, an upper portion of the source electrode SE may be a low-resistance region, and an upper portion of the drain electrode DE may be a low-resistance region. Each low-resistance region may have an oxygen concentration lower than the oxygen concentration of the channel portion CH. The low-resistance regions in the thin film transistor TR may be formed by a self-alignment scheme. The oxygen concentration of each low-resistance region is required to be maintained equal to or lower than 30% since the resistance of either of the source electrode SE and the drain electrode DE may increase if the associated oxygen concentration in the low-resistance region exceeds 30%.

In addition to the low-resistance region, each of the source electrode SE and the drain electrode DE may include an oxide semiconductor region having an oxygen concentration substantially equal to the oxygen concentration of the channel portion CH. In one or more embodiment, a lower portion of the source electrode SE may be an oxide semiconductor region, and a lower portion of the drain electrode DE may be an oxide semiconductor region.

A gate insulating layer 114 and the gate electrode GE are sequentially stacked on the channel portion CH and may have substantially the same bottom shape. In one or more embodiments, the gate insulating layer 114 has a double-layer structure that includes silicon nitride (SiNx) and silicon oxide (SiOx). In one or more embodiments, a first layer 114a of the gate insulating layer 114 includes silicon nitride (SiNx), and a second layer 114b disposed on the first layer 114a of the gate insulating layer 114 includes silicon oxide (SiOx).

The gate electrode GE is disposed on the second layer 114b of the gate insulating layer 114 and may directly contact the second layer 114b of the gate insulating layer 114. The gate electrode GE has a double-layer structure that includes titanium (Ti) and copper (Cu) in one or more embodiments. In one or more embodiments, the gate electrode GE includes a first metal layer ML1, e.g., a titanium (Ti) layer, and a second metal layer ML2, e.g., a copper (Cu) layer, that is disposed on the first metal layer ML1. In one or more embodiments, the gate electrode GE may have a single-layer structure.

A protective layer 115 is formed on the gate electrode GE, the source electrode SE, the drain electrode DE, and the buffer layer 112. The protective layer 115 is formed of silicon nitride (SiNx). The protective layer 115 is provided with a first contact hole C1, a second contact hole C2, and a third contact hole C3 formed therethrough. The first contact hole C1 exposes a portion of the drain electrode DE, and the second contact hole C2 exposes a portion of the source electrode SE. The third contact hole C3 is formed by removing a portion of the protective layer 115 and a portion of the buffer layer 112 to expose a portion of the first data line DL1.

Transparent electrodes are provided on the portion of the protective layer 115 and the exposed portions through the first, second, and third contact holes C1, C2, and C3. In one or more embodiments, the transparent electrodes include the pixel electrode PE disposed on a portion of the protective layer 115 to contacts the drain electrode DE through the first contact hole C1. In one or more embodiments, the transparent electrodes include the bridge electrode BE, which contacts the source electrode SE and contacts the first data line DL1 through the second contact hole C2 and the third contact hole C3 so as to electrically connect the source electrode SE and the first data line DL1.

Each of the pixel electrode PE and the bridge electrode BE includes a first electrode layer 116a formed of a transparent metal material and a second electrode layer 116b formed of a transparent conductive oxide (TCO) and disposed on the first electrode layer 116a. In one or more embodiments, the first electrode layer 116a includes titanium (Ti) and has a thickness greater than or equal to about 20 angstroms and less than or equal to about 300 angstroms, and the second electrode layer 116b includes indium tin oxide (ITO) or indium zinc oxide (IZO) and has a thickness greater than or equal to about 20 angstroms and less than or equal to about 300 angstroms. The first electrode layer 116a, e.g., a titanium (Ti) layer, has a light transmittance equal to or higher than that of the second electrode layer 116b, e.g., a transparent conductive oxide (TCO) layer, within the thickness range of about 20 angstroms to about 300 angstroms.

An oxide insulating layer 117 is disposed on the protective layer 115 to correspond to an area in which the pixel electrode PE and the bridge electrode BE are not formed. At least a portion of the oxide layer 117 may be disposed between the pixel electrode PE and the bridge electrode BE. In one or more embodiments, the oxide insulating layer 117 includes titanium dioxide (TiOx). The oxide insulating layer 117 may have substantially the same thickness as the first electrode layer 116a, e.g., in a range of about 20 angstroms to about 300 angstroms.

The oxide insulating layer 117 may reinforce a passivation function performed by the protective layer 115.

FIGS. 4A to 4I are cross-sectional views illustrating a manufacturing process of the pixel illustrated in FIG. 3.

Figure 4A:
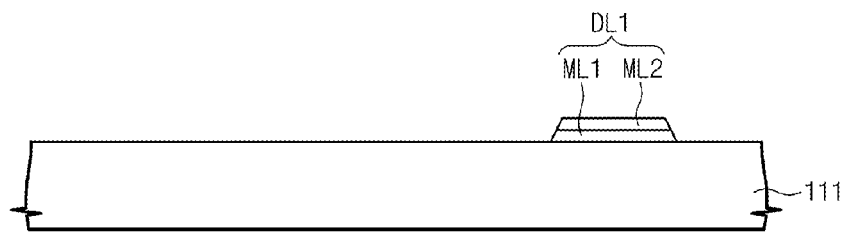
FIGS. 4A to 4I are cross-sectional views illustrating a manufacturing process of the pixel illustrated in FIG. 3.

Referring to FIG. 4A, a first metal layer ML1, e.g., a titanium (Ti) layer, and a second metal layer ML2, e.g., a copper (Cu) layer, are sequentially deposited on the base substrate 111. Subsequently, the first and second metal layers ML1 and ML2 are patterned through a photo process and a wet etching process to form the first data line DL1. In one or more embodiments, the first metal layer ML1 and/or the second metal layer ML2 may be formed of aluminum (Al) and/or chromium (Cr), other than titanium (Ti).

Figure 4B:
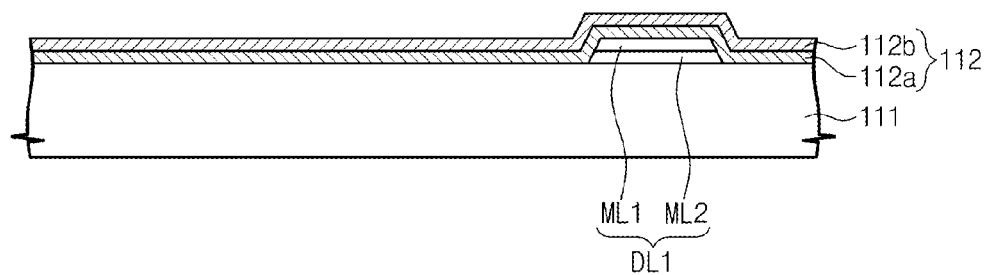

As illustrated in FIG. 4B, the buffer layer 112 is formed on the base substrate 111 to cover the first data line DL1. In one or more embodiments, the buffer layer 112 has a double-layer structure that includes silicon nitride (SiNx) and silicon oxide (SiOx). In one or more embodiments, the first layer 112a of the buffer layer 112 includes silicon nitride (SiNx), and the second layer 112b of the buffer layer 112 includes silicon oxide (SiOx). The first layer 112a is disposed between the second layer 112b and the base substrate 111. In one or more embodiments, each of the first layer 112a and the second layer 112b has a thickness of about 1000 angstroms.

Figure 4C:
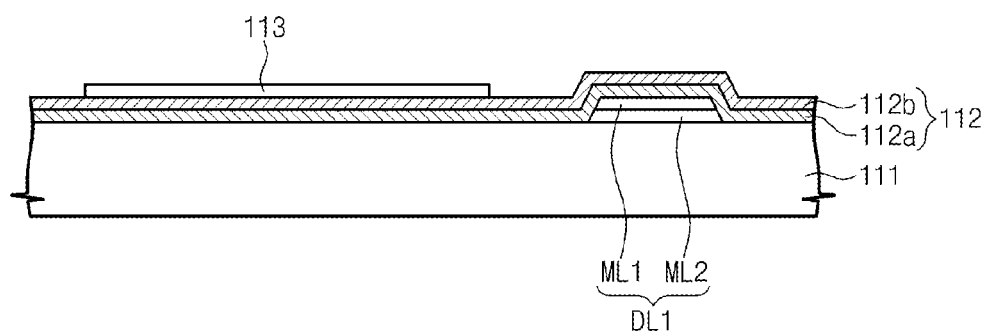

Referring to FIG. 4C, the oxide semiconductor layer 113 is disposed on the buffer layer 112. The oxide semiconductor layer 113 is located in the area in which the thin film transistor TR (illustrated in FIG. 2) is to be formed. The oxide semiconductor layer 113 may include an amorphous zinc oxide semiconductor material. The oxide semiconductor transistor having the amorphous zinc oxide semiconductor material may have sufficiently high mobility and may be manufactured using a low temperature process.

In one or more embodiments, the oxide semiconductor transistor may be manufactured using amorphous indium gallium zinc oxide (a-IGZO), which may be obtained by doping zinc oxide (ZnO) with a heavy metal, such as indium (IN), gallium (Ga), etc.; the oxide semiconductor transistor may transmit a visible light. In one or more embodiments, the oxide semiconductor transistor manufactured using amorphous indium gallium zinc oxide (a-IGZO) may have mobility in a range of about 1 to about 100 cm/Vs, which is relatively higher than that of an amorphous silicon thin film transistor.

Figure 4D:
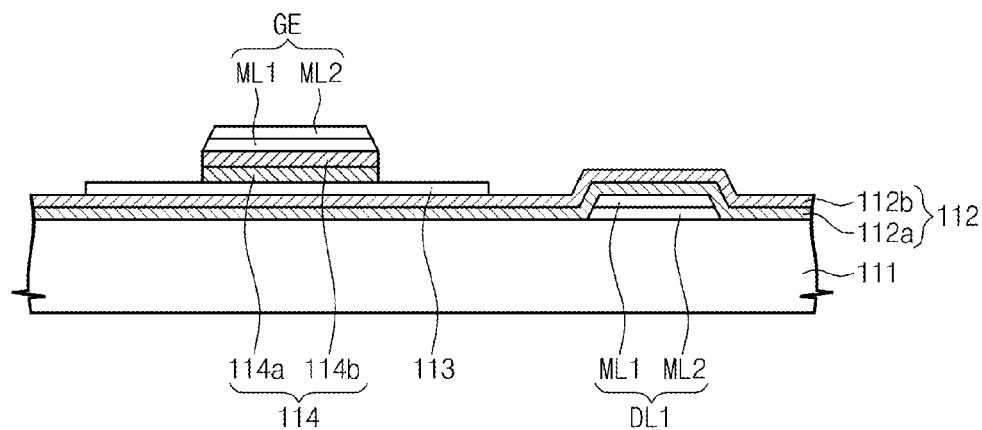

Referring to FIG. 4D, a gate insulating material and a gate electrode material are sequentially formed on at least the oxide semiconductor layer 113. In one or more embodiments, a silicon nitride (SiNx) layer and a silicon oxide (SiOx) layer are sequentially deposited through a plasma-enhanced chemical vapor deposition (PE-CVD) process, and a first metal layer ML1, e.g., a titanium (Ti) layer, and a second metal layer ML2, e.g., a copper (Cu) layer, are sequentially deposited on the silicon oxide (SiOx) layer through a sputtering process.

Subsequently, the first metal layer ML1 and the second metal layer ML2 are patterned using a photo process and a wet etching process to form the gate electrode GE on a portion of the oxide semiconductor layer 113, e.g., the channel portion CH illustrated in FIG. 3. Subsequently, the gate insulating material is patterned through a dry etching process to form the gate insulating layer 114, which may include the first layer 114a and the second layer 114b disposed on the first layer 114a. The gate insulating layer 114 is interposed between the gate electrode GE and the channel portion CH of the oxide semiconductor layer 113.

Figure 4E:
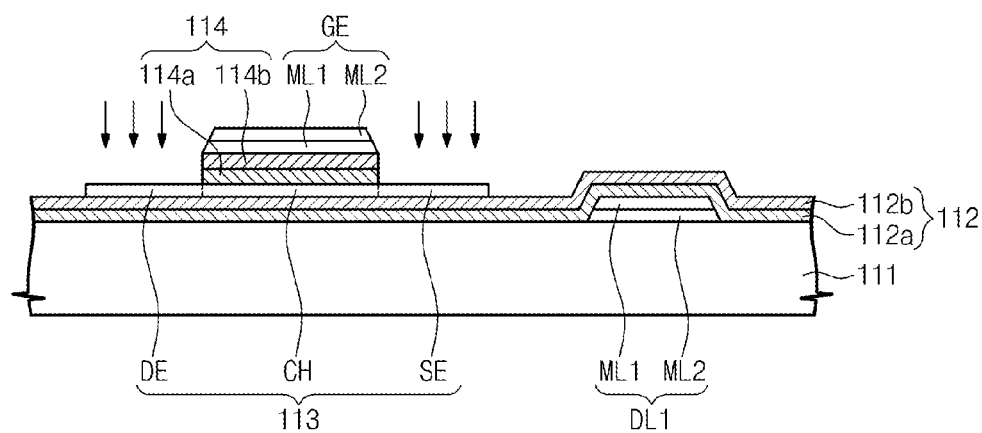

Referring to FIG. 4E, a plasma, which may include one or more of hydrogen gas ($H_2$), argon gas (Ar), ammonia gas ($NH_3$), etc., is generated using a plasma-enhanced chemical vapor deposition (PE-CVD) apparatus. Both end portions of the oxide semiconductor layer 113, which are not covered by the gate insulating layer 114 and the gate electrode GE, are exposed to the plasma.

Hydrogen atoms may diffuse from the upper surfaces of the exposed end portions of the oxide semiconductor layer 113 in a depth direction substantially perpendicular to the upper surfaces of the exposed end portions, so that a low-resistance region is formed in each of the end portions. An upper portion of each of the exposed end portions may become a low-resistance region. Since a low-resistance region has an oxygen concentration lower than that of the channel portion CH, the low-resistance region has resistance lower than that of the channel portion CH. Accordingly, the end portions of the oxide semiconductor layer 113, each including a low-resistance region, may have metal properties different from properties of the channel portion CH and may serve as the source electrode SE and the drain electrode DE.

In one or more embodiments, one or more of the low-resistance regions may be formed using an ion doping method and/or an ion injection method, alternative to or in addition to the PE-CVD method.

Figure 4F:
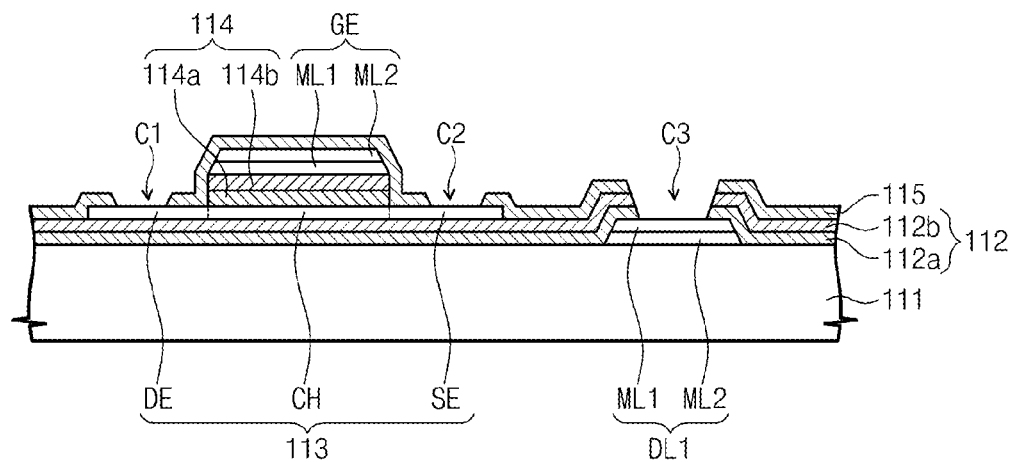

Referring to FIG. 4F, the protective layer 115 is deposited on the gate electrode GE, the source electrode SE, the drain electrode DE, and the buffer layer 112 using a PE-CVD process. In one or more embodiments, the protective layer 115 is formed of silicon nitride (SiNx) and has a thickness of about 1000 angstroms. Subsequently, the contact holes C1, C2, and C3 are formed through the protective layer 115 using a photo process and a dry etching process. In one or more embodiments, the first contact hole C1 exposes a portion of the drain electrode DE, and the second contact hole C2 exposes a portion of the source electrode SE. The third contact hole C3 is formed by removing a portion of the protective layer 115 and a portion of the buffer layer 112 to expose a portion of the first data line DL1, i.e., a portion of the upper surface of the second metal layer ML2 of the first data line DL1.

Figure 4G:
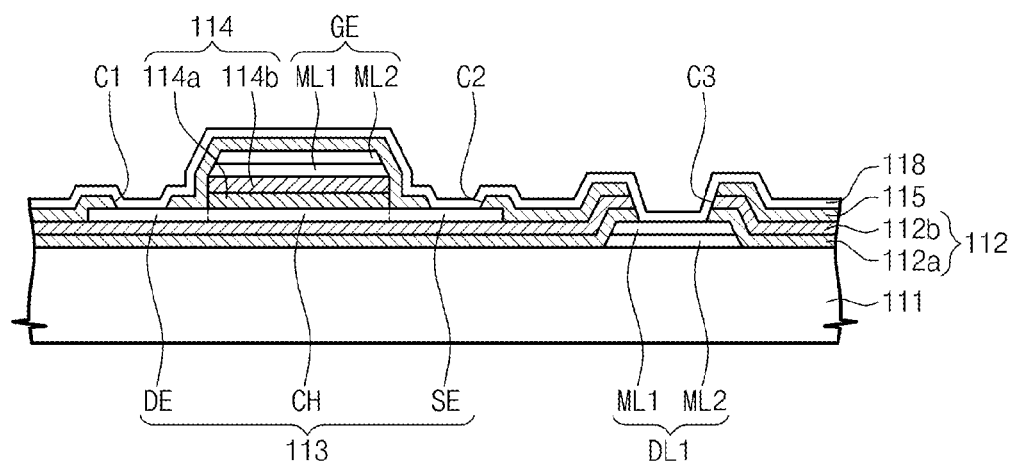

Referring to FIG. 4G, a first transparent electrode layer 118 is deposited on the protective layer 115 and the portions exposed through the contact holes C1, C2, and C3 using a sputtering process. The first transparent electrode layer 118 may include one or more of titanium, titanium alloy, and molybdenum. In one or more embodiments, the first transparent electrode layer 118 has the thickness in a range of about 20 angstroms to about 300 angstroms. In one or more embodiments, the metal material, which may include one or more of titanium, titanium alloy, and molybdenum, etc., has a light transmittance equal to or higher than that of a transparent conductive oxide (TCO) layer as long as the thickness of the metal layer is in a range of about 20 angstroms to about 300 angstroms. In one or more embodiments, the thickness of the first transparent electrode layer 118 is required to be in the range of about 20 angstroms to about 300 angstroms.

Figure 4H:
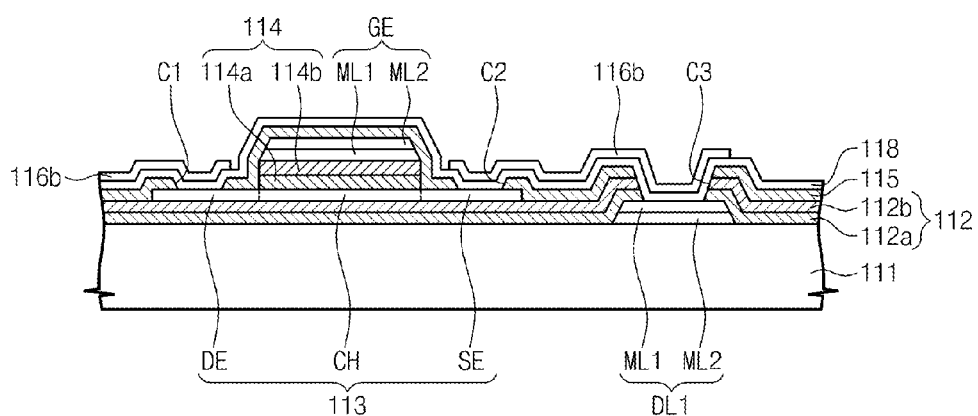

Referring to FIG. 4H, a second transparent electrode layer is formed on the first transparent electrode layer 118. The second transparent electrode layer includes the transparent conductive oxide (TCO), which may include one or more of indium tin oxide (ITO), indium zinc oxide (IZO), etc. Subsequently, the second transparent electrode layer is patterned using a photo process and a wet etching process to form the second electrode layer 116b.

Figure 4I:
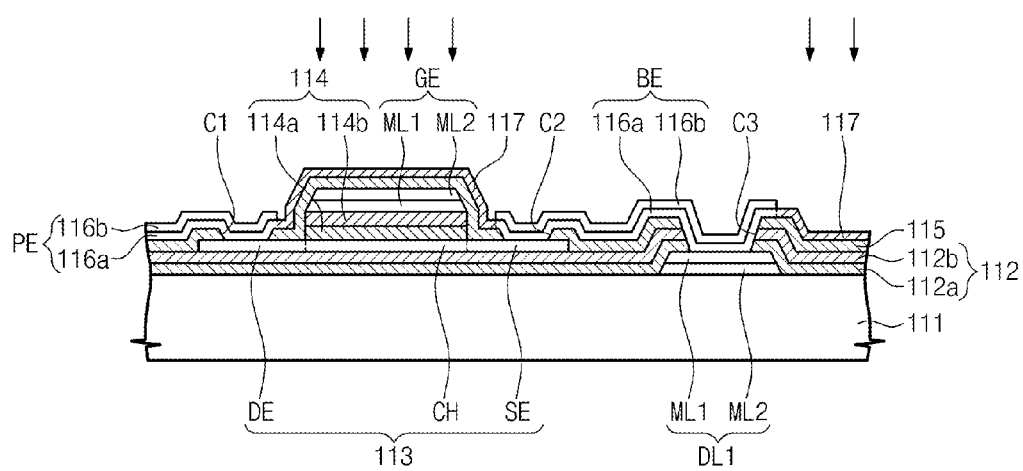

As illustrated in FIG. 4I, an oxygen plasma treatment process is performed on the first transparent electrode layer 118 using the second electrode layer 116b as a mask. Accordingly, the plasma-treated portion of the first transparent electrode layer 118, exposed by the second electrode layer 116b, is oxidized and the resistance of the plasma-treated portion of the first transparent electrode layer 118 increases. As a result, the plasma-treated portion of the first transparent electrode layer 118 forms the oxide insulating layer 117.

In one or more embodiments, the first transparent electrode layer 118 includes titanium, and the oxide insulating layer 117 includes titanium dioxide (TiOx).

The oxide insulating layer 117 serves as a buffer to reinforce the passivation function of the protective layer 115. In one or more embodiments, the protective layer 115 has a single-layer structure consisting of a silicon nitride (SiNx) layer, and the oxide insulating layer 117 may help the protective layer 115 prevent impurities from infiltrating into layers under the protective layer 115.

A process condition of the oxygen plasma treatment process may be configured to allow the oxide insulating layer 117 to have desired properties.

Figure 5:
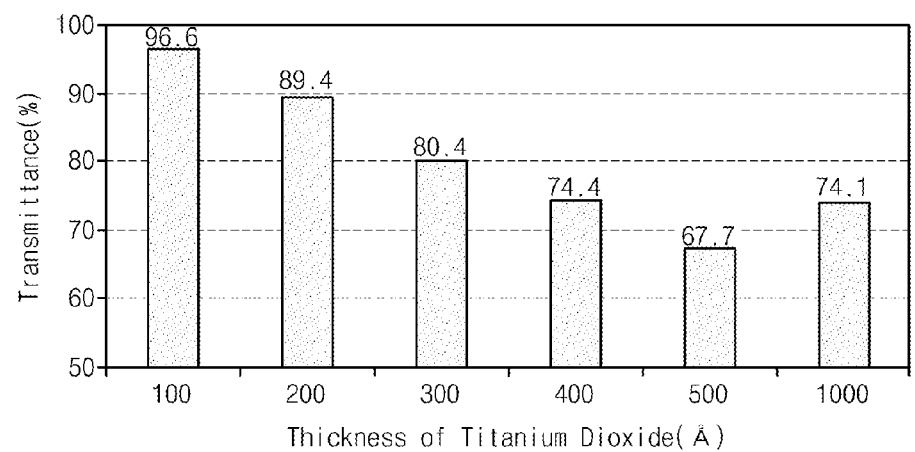
FIG. 5 is a graph illustrating a transmittance as a function of a thickness of titanium dioxide.
Figure 6:
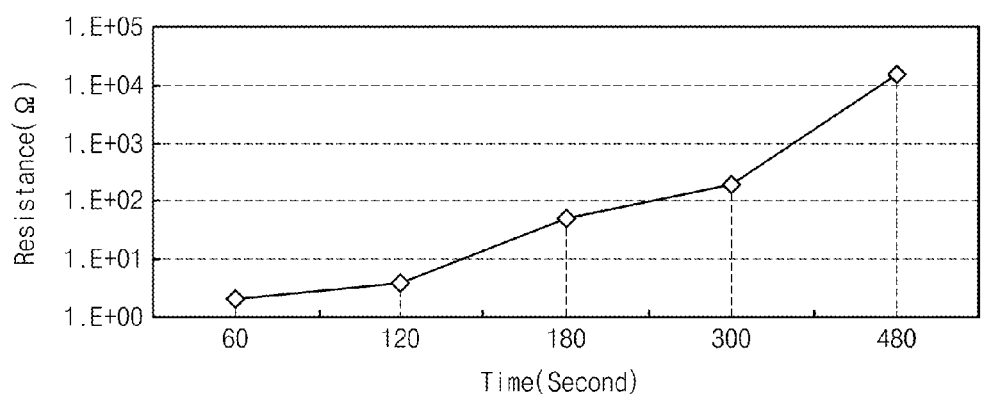
FIG. 6 is a graph illustrating a resistance as a function of a time duration of an oxide plasma treating process.

FIG. 5 is a graph illustrating a transmittance as a function of a thickness of titanium dioxide. FIG. 6 is a graph illustrating a resistance as a function of a time duration of an oxide plasma treating process.

Referring to FIG. 5, if the thickness of the titanium dioxide is more than about 300 angstroms, the transmittance is more than 80%. Since the transparent conductive oxide (TCO) has a transmittance of about 80%, the thickness of the titanium dioxide is set lower than about 300 angstroms. Nevertheless, if the thickness of the titanium dioxide is too thin, e.g., thinner than 20 angstroms, the passivation function of the titanium dioxide may become too weak. Thus, the titanium dioxide is required to have a thickness in a range of about 20 angstroms to about 300 angstroms.

Referring to FIG. 6, if the processing time of the oxygen plasma treatment process increases, the resistance of the titanium dioxide increases. Especially, if the processing time of the oxygen plasma treatment process is more than 300 seconds, the titanium dioxide serve as an insulating layer because of its high resistance and the longer treatment allows the resistance to be more than 1MΩ.

In one or more embodiments, the oxygen plasma treatment process may be performed until the titanium dioxide has a resistance of about 1MΩ and more.

Referring to FIG. 4I again, since a portion of the first transparent electrode layer 118 covered by the second electrode layer 116b is not exposed to the oxygen plasma treatment process, the covered portion of the first transparent electrode layer 118 is not oxidized. Therefore, the covered portion of the first transparent electrode layer 118, which is disposed under the second electrode layer 116b, maintains electrical conductivity. The covered portion of the first transparent electrode layer 118, which is disposed under the second electrode layer 116b, may be referred to as the first electrode layer 116a.

As illustrated in FIG. 4H and FIG. 4I, the first electrode layer 116a and the oxide insulating layer 117 are formed from the same layer, i.e., the first transparent electrode 118.

In one or more embodiments, the pixel electrode PE, which contacts the drain electrode DE through the first contact hole C1, has a double-layer structure that includes the electrode layers 116a and 116b. In one or more embodiments, the bridge electrode BE, which contacts the source electrode SE and the first data line DL1 respectively through the contact holes C2 and C3 to electrically connect the source electrode SE and the first data line DL1, has a double-layer structure that includes the first and second electrode layers 116a and 116b.

In one or more embodiments, the transparent metal material (for forming the first electrode layer 116a) has a resistance lower than that of the transparent conductive oxide (for forming the second electrode layer 116b). Since the pixel electrode PE has the double-layer structure, which includes the first electrode layer 116a disposed under the second electrode layer 116b, the contact resistance in the first contact hole C1 may be substantially lower than a pixel electrode PE that includes only a transparent conductive oxide without including a metal layer. Advantageously, embodiments of the invention may include and/or may provide a pixel electrode PE that provides satisfactory conductivity.

Analogously, since the bridge electrode BE includes the metal first electrode layer 116a, the contact resistance in the contact holes C2 and C3 may be satisfactory low. In other words, the contact resistance between the bridge electrode BE and the source electrode SE and the contact resistance between the bridge electrode BE and the first data lined DL1 may be satisfactorily low. Advantageously, embodiments of the invention may include and/or may provide a bridge electrode BE that provides satisfactory conductivity.

In one or more embodiments, since the contact resistance between electrodes is satisfactorily low, the driving voltage required to drive the pixel PX may be satisfactorily low.

Figure 7A:
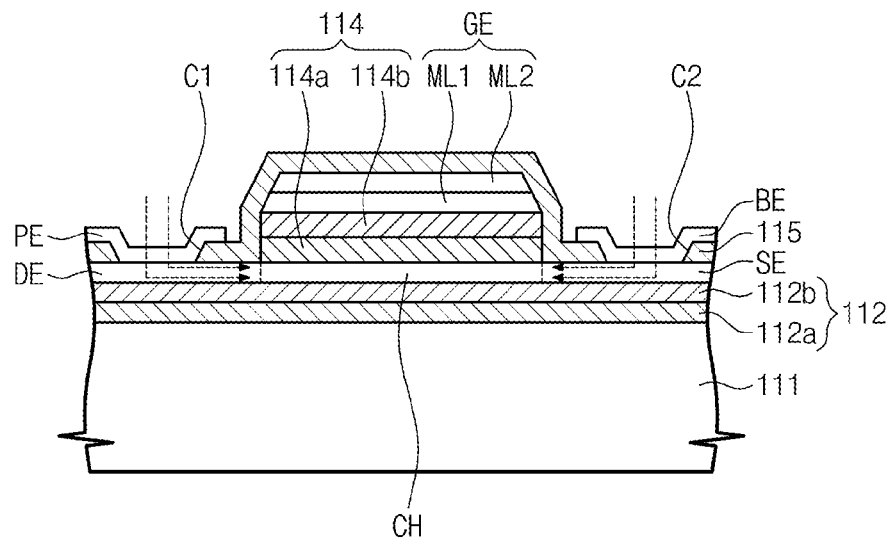
FIG. 7A is a cross-sectional view illustrating hydrogen diffusion according to one or more embodiments of the present invention.
Figure 7B:
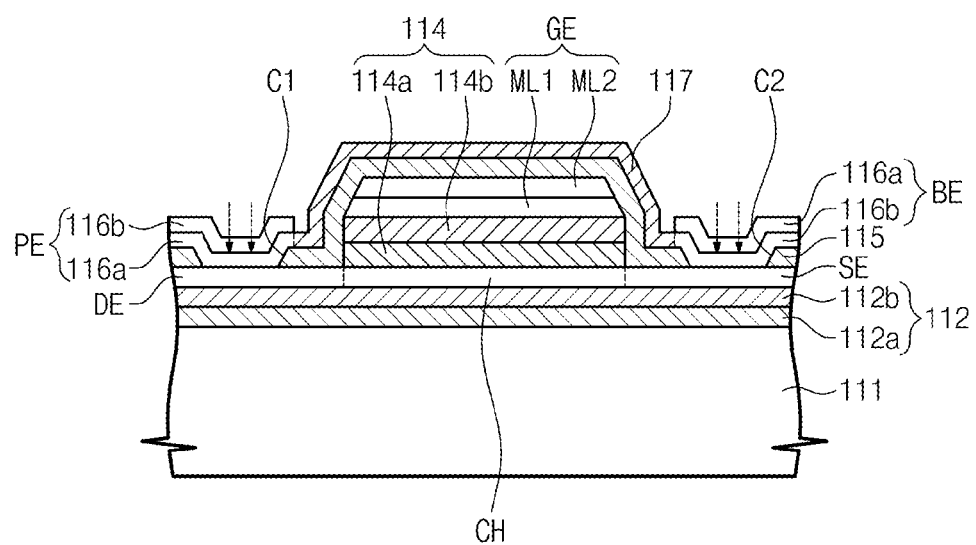
FIG. 7B is a cross-sectional view illustrating hydrogen diffusion according to one or more embodiments of the present invention.

FIG. 7A is a cross-sectional view illustrating hydrogen atom diffusion according to one or more embodiments of the present invention. FIG. 7B is a cross-sectional view illustrating hydrogen atom diffusion according to one or more embodiments of the present invention. In detail, FIG. 7A illustrates hydrogen atom diffusion given that each of the pixel electrode PE and the bridge electrode BE has the single-layer structure of the transparent conductive oxide, and FIG. 7B illustrates hydrogen atom diffusion given that each of the pixel electrode PE and the bridge electrode BE has a double-layer structure that includes the first electrode layer 116a including the transparent metal material and the second electrode layer 116b including the transparent conductive oxide.

Referring to FIG. 7A, in the case that each of the pixel electrode PE and the bridge electrode BE has a single-layer structure consisting of only the transparent conductive oxide, hydrogen atoms from the environment may react with oxygen atoms included in the transparent conductive oxide (TCO), and thus the hydrogen atom diffusion may occur. The hydrogen atoms may diffuse to the channel portion CH via the source electrode SE and the drain electrodes DE to cause corrosion of the channel portion CH.

Referring to FIG. 7B, in the case that each of the pixel electrode PE and the bridge electrode BE further includes the first electrode layer 116a formed of the transparent metal material, e.g., titanium (Ti), under the second electrode layer 116b, the hydrogen atoms diffusing to the second electrode layer 116b are blocked by the first electrode layer 116a. Accordingly, given that each of the pixel electrode PE and the bridge electrode BE has a double-layer structure that includes the first electrode layer 116a and the second electrode 116b, the hydrogen atoms may be prevented from diffusing to the channel portion CH. Advantageously, the channel durability and stability in the thin film transistor TR may be improved.

Figure 8:
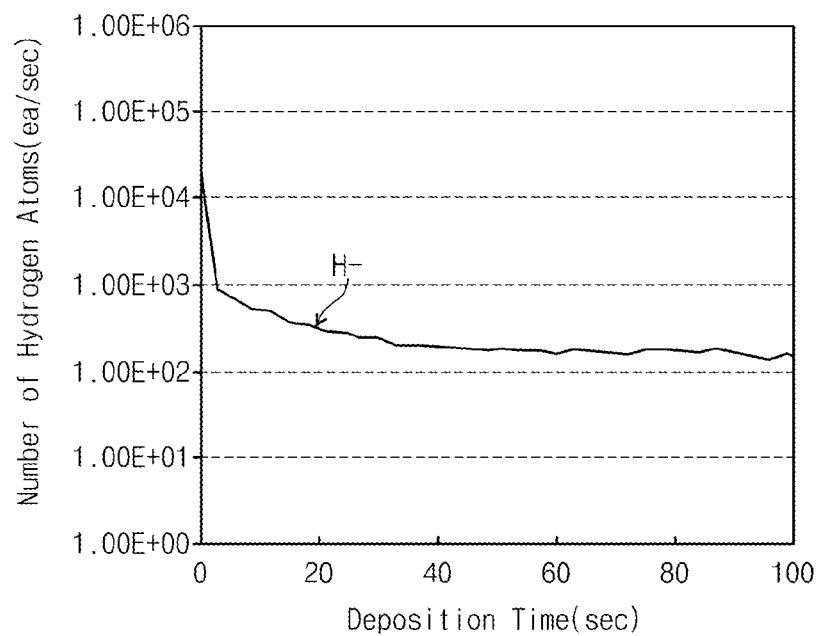
FIG. 8 is a graph illustrating hydrogen diffusion represented by the number of hydrogen atoms over deposition time.

FIG. 8 is a graph illustrating hydrogen atom diffusion in the channel portion CH measured by performing a sputtering process on the structure illustrated in FIG. 7B using TOF-SIMS sputter.

Referring to FIG. 8, when the portions adjacent to the contact holes C1 and C2 illustrated in FIG. 7B are sputtered using the sputtering apparatus, e.g., TOF-SIMS (time-of-flight secondary ion mass spectroscopy), the diffusion rate of the hydrogen atoms is reduced to about 1.00E+02 ea/sec from about 1.00E+04 ea/sec.

Particularly, the hydrogen atoms are blocked by the first electrode layer 116a at an early stage of the sputtering process, and thus the diffusion rate of the hydrogen atoms is rapidly reduced. After the early stage of the sputtering process, the diffusion rate of the hydrogen atoms is gradually decreased.

As described above, since the diffusion rate of the hydrogen atoms diffusing to the channel portion CH is rapidly decreased, the channel stability of the thin film transistor TR may be substantially maintained.

Figure 9A:
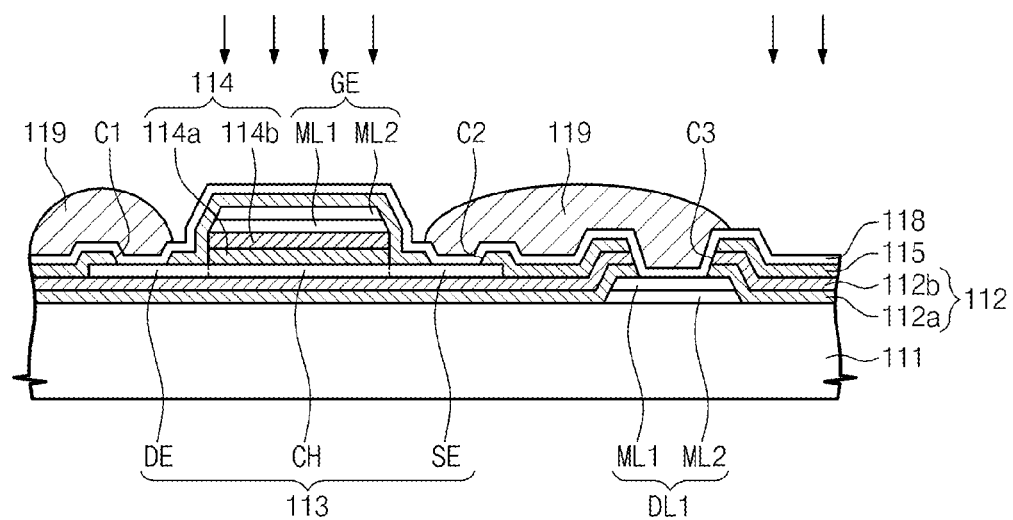
FIGS. 9A to 9C are cross-sectional views illustrating a method of forming an oxide insulating layer according to one or more embodiments of the present invention.
Figure 9B:
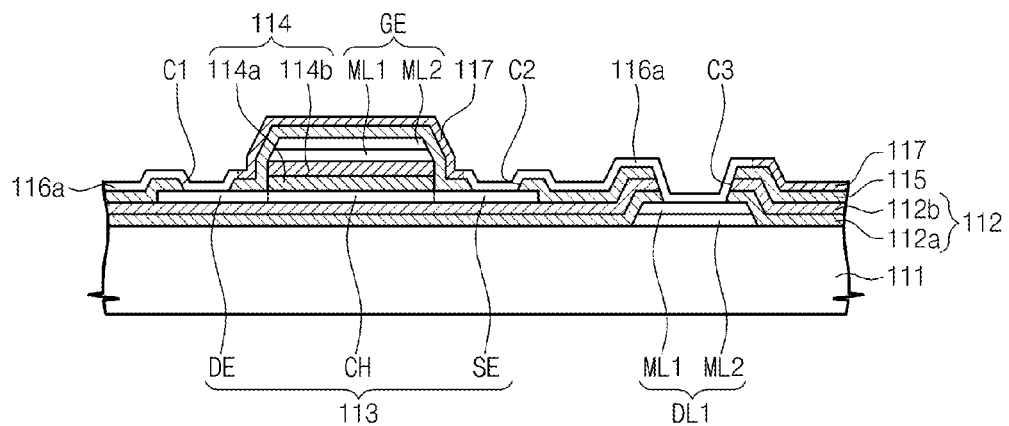
Figure 9C:
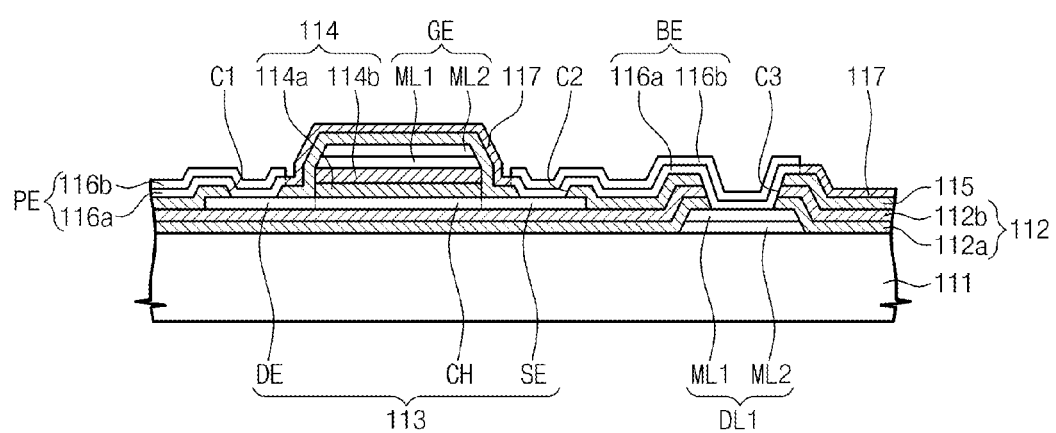

FIGS. 9A to 9C are cross-sectional views illustrating a method of forming an oxide insulating layer according to one or more embodiments of the present invention. In one or more embodiments, the processes before forming the first transparent electrode layer 118 and the process of forming the first transparent electrode layer 118 may be analogous to described with reference to FIGS. 4A to 4G, and detailed descriptions of the analogous processes may be omitted.

Referring to FIG. 9A, a mask 119 is formed on the first transparent electrode layer 118. In one or more embodiments, the mask 119 includes a blocking pattern that covers portions of the first transparent electrode layer 118 in the area in which the pixel electrode PE and the bridge electrode BE are to be formed and exposes portions of the first transparent electrode layer 118 where the pixel electrode PE and the bridge electrode BE are not to be formed.

After the mask 119 is formed, an oxygen plasma treatment process is performed on the exposed portions of the first transparent electrode layer 118. Accordingly, the exposed portion of the first transparent electrode layer 118 is oxidized, and the associated resistance increases, so that the exposed portions of the first transparent electrode layer 118 may form the oxide insulating layer 117 illustrated in FIG. 9B.

In one or more embodiments, the first transparent electrode layer 118 includes titanium, and the oxide insulating layer 117 may include titanium dioxide (TiOx).

Subsequently, the mask 119 is removed through a strip process. The remaining portions of the first transparent electrode layer 118, which are covered by the mask 119, may maintain electrical conductivity. Accordingly, the remaining portions of the first transparent electrode layer 118 may serve as the first electrode layer 116a.

As illustrated in FIG. 9B, the first electrode layer 116a and the oxide insulating layer 117 are formed from the same layer, i.e., the first transparent electrode layer 118.

Referring to FIG. 9C, a second transparent electrode layer is formed on the first electrode layer 116a and the oxide insulating layer 117. The second transparent electrode layer is patterned using a photo process and a wet etching process to form the second electrode layer 116b on the first electrode layer 116a.

In one or more embodiments, the pixel electrode PE, which contacts the drain electrode DE through the first contact hole C1, has a double-layer structure that includes the first electrode layer 116a and the second electrode layer 116b. The first electrode layer 116a is disposed between the second electrode layer 116b and the drain electrode DE. In one or more embodiments, the bridge electrode BE, which contacts the source electrode SE and the first data line DL1 respectively through the holes C2 and C3 to electrically connect the source electrode SE and the first data line DL1, has a double-layer structure that includes the first electrode layer 116a and the second electrode layer 116b. The first electrode layer 116a is disposed between the second electrode layer 116b and the source electrode SE. The first electrode layer 116a is disposed between the second electrode layer 116b and the first data line DL1.

Figure 10A:
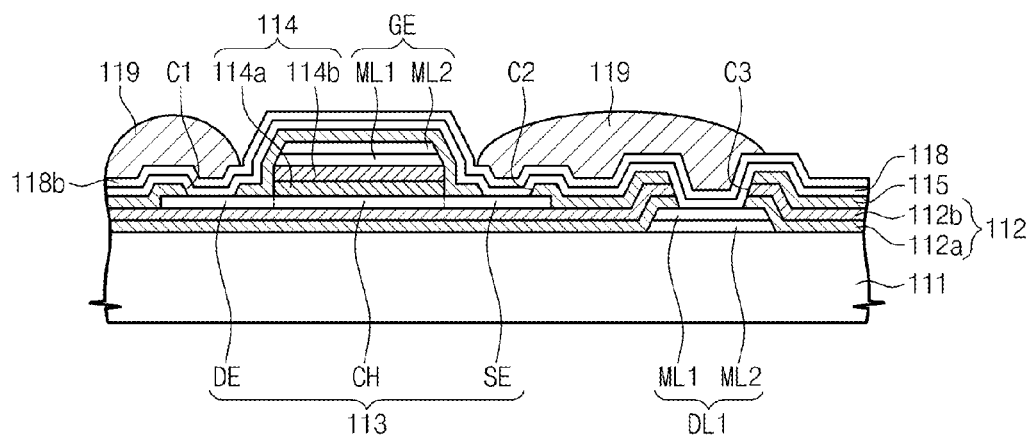
FIGS. 10A to 10C are cross-sectional views illustrating a method of forming an oxide insulating layer according to one or more embodiments of the present invention.
Figure 10B:
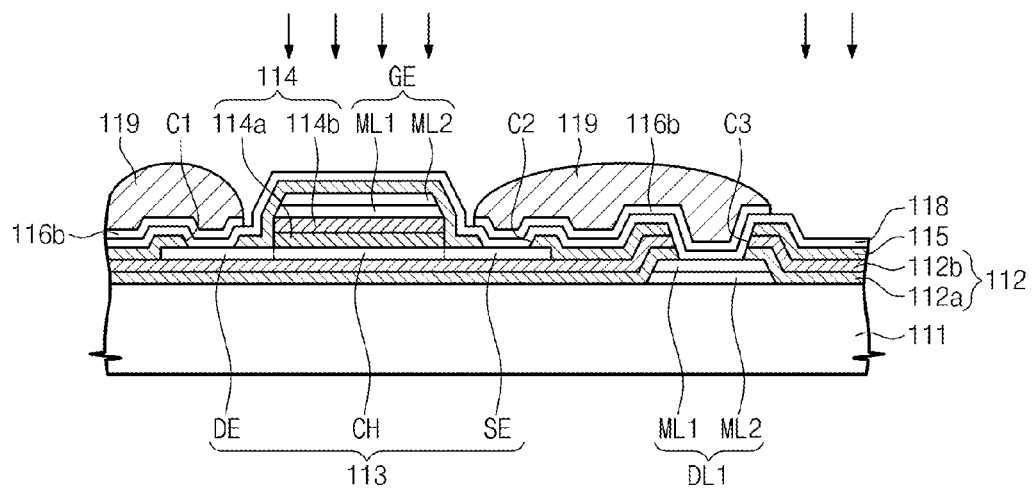
Figure 10C:
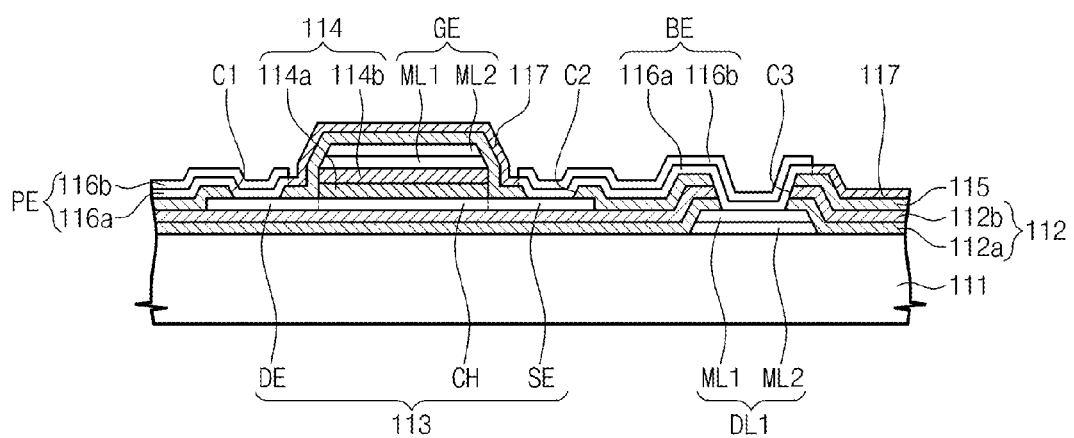

FIGS. 10A to 10C are cross-sectional views illustrating a method of forming an oxide insulating layer according to one or more embodiments of the present invention. In the one or more embodiments, the processes before forming the first transparent electrode layer 118 and the process of forming the first transparent electrode layer 118 may be analogous to those described with reference to FIGS. 4A to 4G, and detailed descriptions of the analogous processes may be omitted.

Referring to FIG. 10A, a second transparent electrode layer 118*b* is formed on the first transparent electrode layer 118. A mask 119 is formed on the second transparent electrode layer 118*b*. In one or more embodiments, the mask 119 includes a blocking pattern that covers portions of the second transparent electrode layer 118*b* and portions of the first transparent electrode layer 118 in the area in which the pixel electrode PE and the bridge electrode BE are to be formed and exposes portions of the second transparent electrode layer 118*b* and portions of the first transparent electrode layer 118 where the pixel electrode PE and the bridge electrode BE are not to be formed.

After the mask 119 is formed, the second transparent electrode layer 118*b* is etched such that the second electrode layer 116*b* is formed on the first transparent electrode layer 118 according to the blocking pattern of the mask 119.

Subsequently, an oxygen plasma treatment process is performed on portions of the first transparent electrode layer 118 that are not covered by the mask 119 and the second electrode layer 116*b*. Accordingly, the exposed portion of the first transparent electrode layer 118 is oxidized, and the associated resistance increases, so that the exposed portion of the first transparent electrode layer 118 may form the oxide insulating layer 117 illustrated in FIG. 10C.

In one or more embodiments, the first transparent electrode layer 118 includes titanium, and the oxide insulating layer 117 may include titanium dioxide (TiOx).

Subsequently, the second mask 119 is removed through a strip process. The remaining portions of the first transparent electrode layer 118, which are covered by the mask 119 and the second electrode layer 116, may maintain electrical conductivity. Accordingly, the remaining portions of the first transparent electrode layer 118 may serve as the first electrode layer 116*a*.

As illustrated in FIG. 10C, the first electrode layer 116*a* and the oxide insulating layer 117 are formed from the same layer, i.e., the first transparent electrode layer 118.

In one or more embodiments, the pixel electrode PE, which contacts the drain electrode DE through the first contact hole C1, has a double-layer structure that includes the first electrode layer 116*a* and the second electrode layer 116*b*. In one or more embodiments, the bridge electrode BE, which contacts the source electrode SE and the first data line DL1 respectively through the contact holes C2 and C3 to electrically connect the source electrode SE and the first data line DL1, has a double-layer structure that includes the first electrode layer 116*a* and the second electrode layer 116*b*.

Although embodiments of the present invention have been described, it is understood that the present invention should not be limited to these embodiments. Various changes and modifications can be made by one ordinary skilled in the art within the spirit and scope of the present invention as hereinafter claimed.

What is claimed is:

1. A display apparatus comprising:
   a base substrate;
   a buffer layer disposed on the base substrate;
   an oxide semiconductor layer disposed on the buffer layer and including a source electrode, a drain electrode, and a channel portion;
   a gate insulating layer disposed on the channel portion;
   a gate electrode disposed on the gate insulating layer;
   a protective layer disposed on the gate electrode and the buffer layer and having a first contact hole; and
   a first transparent electrode overlapping a first portion of the protective layer and electrically connected to one of the source electrode and the drain electrode through the first contact hole, wherein the first transparent electrode includes a first transparent metal layer and a first transparent conductive oxide layer overlapping the first transparent metal layer.

2. The display apparatus of claim 1, further comprising an oxide insulating layer overlapping a second portion of the protective layer and abutting the first transparent metal layer.

3. The display apparatus of claim 2, wherein the first transparent metal layer comprises titanium and has a thickness in a range of about 20 angstroms to about 300 angstroms.

4. The display apparatus of claim 2, further comprising a second transparent electrode,
   wherein the protective layer further has a second contact hole,
   wherein the second transparent electrode is electrically connected to another one of the source electrode and the drain electrode through the second contact hole,
   wherein the second transparent electrode includes a second transparent metal layer and a second transparent conductive oxide layer, and
   wherein the second transparent metal layer abuts the oxide insulating layer and is connected through the oxide insulating layer to the first transparent metal layer.

5. The display apparatus of claim 4,
   wherein the protective layer further has a third contact hole,
   wherein the second transparent electrode is electrically connected to a data line through the third contact hole, and
   wherein the second transparent metal layer is disposed between the second transparent conductive oxide layer and the data line.

6. The display apparatus of claim 2, wherein the oxide insulating layer comprises titanium dioxide (TiOx).

7. The display apparatus of claim 1, wherein the oxide semiconductor layer comprises an amorphous zinc oxide semiconductor material.

8. The display apparatus of claim 6, wherein the oxide semiconductor layer comprises an amorphous indium gallium zinc oxide (a-IGZO) semiconductor material.

* * * * *